United States Patent [19]
Douglas

[11] Patent Number: 4,690,729
[45] Date of Patent: Sep. 1, 1987

[54] TAPERED TRENCH PROCESS

[75] Inventor: Monte A. Douglas, Coppell, Tex.

[73] Assignee: Texas Instruments Incorporated, Dallas, Tex.

[21] Appl. No.: 841,391

[22] Filed: Mar. 19, 1986

Related U.S. Application Data

[63] Continuation-in-part of Ser. No. 730,701, May 3, 1985.

[51] Int. Cl.[4] .................. H01L 21/306; B44C 1/22; C03C 15/00; C03C 25/06
[52] U.S. Cl. ............... 156/643; 148/DIG. 50; 156/646; 156/648; 156/653; 156/657; 156/659.1; 156/662; 252/79.1; 427/38; 437/225; 437/228; 204/192.37
[58] Field of Search ............... 156/643, 644, 646, 648, 156/653, 657, 659.1, 662; 204/164, 192 E, 192 EC; 427/86, 88, 93, 94, 38, 39, 309; 148/1, 5, 187, DIG. 50; 29/576 W, 580; 357/23.6, 47, 49, 55, 65; 252/79.1

[56] References Cited

U.S. PATENT DOCUMENTS 4,521,275 6/1985 Purdes .............................. 156/643
4,533,430 8/1965 Bower ............................. 156/662 X Primary Examiner—William A. Powell
Attorney, Agent, or Firm—Leo N. Heiting; N. Rhys Merrett; Melvin Sharp

[57] ABSTRACT

A plasma dry etch process for etching deep trenches in single crystal silicon material with controlled wall profile, for trench capacitors or trench isolation structures. HCl is used as an etchant under RIE conditions with a $SiO_2$ hard mask. The $SiO_2$ hard mask is forward sputtered during the course of the Si etch so as to slowly deposit $SiO_x$ ($x<2$) on the sidewalls of the silicon trench. Since the sidewall deposit shadows etching at the bottom of the trench near the sidewall, the effect of this gradual buildup is to produce a positively sloped trench sidewall without "grooving" the bottom of the trench, and without linewidth loss. This process avoids the prior art problems of mask undercut, which generates voids during subsequent refill processing, and grooving at the bottom of the trench, which is exceedingly deleterious to thin capacitor dielectric integrity.

28 Claims, 8 Drawing Figures

TAPERED TRENCH PROCESS

CROSS-REFERENCE TO RELATED APPLICATIONS

The present invention is a continuation-in-part of the following application: Ser. No. 730,701, filed 05/03/85, pending.

BACKGROUND AND SUMMARY OF THE INVENTION

The present invention relates to integrated circuits incorporating trench structures and to methods for fabricating such integrated circuits.

Fabrication of trenches—i.e. grooves etched in the substrate of an integrated circuit which (regardless of their length) have an aspect ratio (depth to width ratio) greater than 2.5:1, or a width less than 3 microns and a depth greater than one micron—is desirable in several areas of VLSI processing, but this fabrication step presents several distinctive difficulties, at which the present invention is aimed.

Current VLSI trends in CMOS and bipolar technologies require the development of nonencroachment isolation techniques to improve utilization of silicon area for active device fabrication while effectively reducing latch-up susceptibility. That is, when LOCOS isolation is used to separate moat (active device) regions, the field oxide will grow laterally to encroach on the moat regions at the same time it is grown to its desired thickness. This is also a problem with other isolation technologies: the separation required between nearest-neighbor active devices across the isolation structure is likely to be many times the minimum geometry. The need for compact isolation is particularly critical to CMOS VLSI efforts, since present doping levels limit N-to-P tank spacing to 4 to 6 microns. To reduce the required n+ to p+ spacing, silicon trench dry etch processing may be employed to generate deep yet narrow silicon wells between cells that are subsequently refilled with CVD oxide or polysilicon to effect device isolation while maintaining high density and still avoiding latchup.

Another area where trench processing is a critical need is in DRAMs (dynamic random access memories). Higher packing densities may be achieved for dynamic MOS memories if the cell area consumed by the planar storage capacitor can be decreased without decreasing the capacitance below soft error levels. This can be achieved by placing the capacitor dielectric on the sidewalls of a silicon trench etched sufficiently deep to have the equivalent surface area of the planar capacitor. Note that trenches in such applications, unlike those required for isolation, do not tend to be long trenches.

However, the characteristics of the silicon trench must be very carefully controlled to achieve satisfactory results in such applications. The trench cross-sectional profile is of particular concern; for instance, trench profiles where the silicon is undercut with respect to the patterning mask or where "grooving" is exhibited near the bottom of the trench are commonly observed with conventional trench etch processing. Even minutely undercut sidewall profiles will readily promote void formation during the subsequent CVD refill operations commonly used in both trench isolation and trench capacitor processing. These voids are a problem because they can act as a contaminant depository. Moreover, a later etchback step may reopen the void, producing huge filament problems if a conductor is sought to be patterned thereafter. Moreover, etchback to achieve a truly planar surface within the trench, as is desirable for some more advanced processes, becomes impossible. The trench bottom "grooving" can also be exceedingly deleterious: it can degrade the dielectric integrity of a trench capacitor and can promote high, stress-related Si defect densities during thick thermal oxidation.

"Grooving" is believed to be due to nonuniformity generated at the beginning of the etch process. That is, near the beginning of the etch process, the edges of the trench will be exposed to bombardment both by ions coming straight in and by ions which have been slightly deflected by the sidewalls of the trench or by the hard mask, so that the trench will be etched slightly deeper at its edges than near its center. This nonuniformity can be carried forward to the later stages of etching, by the complex effects of autosputtering, so that a trench etched using prior art methods is very likely to have grooves in its bottom next to its sidewalls.

Thus it is an object of the present invention to provide a silicon trench etch which will provide a trench without grooves or spikes or other undesirable topography on the floor of the trench.

A further problem of the prior art is a peculiar form of undercut which may be referred to as retrograde undercut, or bowing. This is different from the ordinary forms of undercut in that the amount of undercut will be almost zero next to the mask, and will typically increase with depth for a distance of a micron or so. This retrograde undercut is believed to be due to scattering of ions from the mask material at the opposite edge of the trench.

Thus it is an object of the present invention to provide a silicon trench etch which will provide a trench with straight (unbowed) sidewalls, and without grooves or other undesirable topography on the floor of the trench.

In the prior art, the natural way to achieve control of trench profile would be to make the etch conditions slightly less anisotropic, e.g. by increasing pressure. However, this approach does not work, for several reasons: first, more isotropic etches make the eventual width of the trench less controllable. Second, if the trench sidewall is anywhere near vertical (as is necessary to retain the advantages which motivate use of a trench in the first place), merely using a more isotropic etch will still tend to produce undercut near the top of the trench, so that voids occur during refill. If the anisotropicity is reduced enough that voids do not occur, the "trench" structure will be so wide that the compact spacing which is much of the object of using trenches will be lost.

The present invention solves these and other problems of the prior art by providing a silicon trench etch process that takes advantage of a selective sidewall deposition to eliminate "grooving" and to provide trenches having controllably and reproducibly sloped trench sidewalls which are positively sloped at a steep angle. The trenches thus provided by the present invention are conducive to subsequent successful refill processing, without sacrificing linewidth control. The process used in the present invention exhibits oxide sidewall deposition that takes place in a slow, continuous, and uniform fashion during the silicon trench etching step. (This is thought to be achieved because portions of the mask are forward sputtered during the etch process, and portions of the forward sputtered mask material (possibly in combination with silicon etch products) produce a thin deposited non-stoichiometric oxide on the sidewalls of the trench as etching proceeds.) In this manner, the deeper portions of the silicon etch are defined on the pattern edge by the sidewall oxide, generating sloped silicon sidewalls as the deposition builds up. In addition, the sidewall deposition prevents "grooving" at the trench bottom. This is probably attributable to a shadowing by the deposition of the trench bottom edge and/or a difference in the ion deflection coefficient off of oxide versus silicon.

In the prior art, there has been experimentation with chemistries which slowly deposit silicon oxide while etching silicon trenches to achieve much higher "selectivity" to the mask $SiO_2$. See Horwitz, Reactive Sputter Etching of Silicon with Very Low Mask-material Etch Rates, 28 IEEE TRANSACTIONS ON ELECTRON DEVICES 1320, which is hereby incorporated by reference. However, this prior art attempt led to uncontrolled deposition: since the deposited oxide is sourced from the gas flow, its deposition locations are determined by the gas flow, and are not (as in the present invention) conveniently and reliably located with respect to the etching process. In the reported prior art, the sidewall oxide deposition had negative consequences in terms of the wall profile, promoting some degree of effective undercut of the mask.

A particular advantage of the processing innovations taught by the present invention is that they produce trenches having a straight, sloped sidewall, without grooving at the bottom or undercut at the top, wherein the slope of the sidewall is steep but controllable. The processing parameters which are controlled to vary the trench sidewall slope are the DC self-bias voltage of the silicon etch step, and the introduction of a small amount of a species such as $BCl_3$ which tends to produce oxide etching. That is, sidewall oxide deposition will be completely eliminated if 3–5 sccm of $BCl_3$ is introduced into the silicon etch mixture, and introduction of lesser amounts of $BCl_3$ will reduce sidewall oxide deposition and therefore steepen the sidewall angle of the trench being etched. Thus, the present invention provides a reproducible process for fabricating trenches having a controlled sidewall slope at a predetermined angle between 80 and 89 degrees, and a flat trench bottom. Moreover, these trenches can easily made to depths formerly impractical, e.g. 8 microns or more.

This structure is itself novel, since there has heretofore been no way to make such an ideal trench. The availability of precisely controlled steep sidewall slope is highly advantageous, since it means that refill problems can be avoided, and also because implanting steps can (if desired) reach the sidewalls of the trench. This may be particularly desirable in trench isolation applications, where such an implant can be used to remove the leakage path due to turn-on of the parasitic transistor at the face of the trench sidewall. It may also be useful in trench capacitor applications, where such an implant can serve as a "Hi-C" implant, or may serve other purposes. (In this case, the hard mask could be made of a composite material, such as oxide/nitride/oxide or poly/oxide, so that some of the hard mask would be left to keep the trench mask pattern for implanting after the throat-choking oxide is removed.)

In particular, the present invention permits fabrication of trench capacitors using very deep trenches. A key problem of trench capacitors generally is getting the capacitance of a minimum geometry capacitor high enough. The present invention contributes to solving two aspects of this problem: first, the deeper a trench the greater its capacitance will be (for a given specific capacitance on the sidewalls). Second, the present invention permits fabrication of trench capacitors so deep that they can reach right through the lightly doped epitaxial layer where active devices are formed, into the heavily doped substrate. Where the substrate is so heavily doped, it is particularly critical to avoid cusping at the bottom of the trench: any geometrically caused electric field increase is more likely to cause breakdown here than in more lightly doped regions, for two reasons: first, since the depletion width is narrower, the electric field across the depletion layer will be higher. Second, the presence of heavy doping here may mean that the quality of a grown oxide is not quite equal to that grown on more lightly doped silicon. Third, the stress present around the cusping will mean that the grown oxide will have less thickness in this critical area than elsewhere. For example, one embodiment of the present invention provides a DRAM cell using 8 micron deep trenches, and deeper trenches could easily be built also.

Thus, the present invention provides at least the following advantages, in addition to others mentioned in this application:

1. A very deep trench can be reproducibly etched with excellent control of geometries.
2. The present invention provides a trench in silicon which has straight (unbowed) sidewalls, and which does not have grooves or other undesirable topography on the floor of the trench.
3. The trenches provided by the present invention are conducive to subsequent successful refill processing, without sacrificing linewidth control.
4. The present invention provides trenches having controllably and reproducibly sloped trench sidewalls which are positively sloped at a steep angle.
5. The present invention (in certain embodiments thereof) provides a DRAM cell having a capacitor in a trench 6 microns or more deep, so that relatively high capacitance can be attained in a trench cell.
6. The present invention (in certain embodiments thereof) provides a DRAM cell having a capacitor in a trench which extends down into a heavily-doped substrate (below the epitaxial layer in which active devices are built), so that relatively high capacitance can be attained in a trench cell.
7. The present invention (in certain embodiments thereof) provides a DRAM cell having a vertical transistor overlying a storage capacitor in a trench 6 microns or more deep, so that relatively high capacitance can be attained in a trench cell while maintaining good pass transistor performance and good trench refill characteristics.

According to the present invention there is provided: A process for etching trenches in silicon, comprising the steps of: providing a patterned hard mask over a silicon substrate; plasma etching exposed portions of said silicon substrate under etch conditions such that the material of said hard mask is forward sputtered to induce deposition on sidewalls of said trench during etching.

According to the present invention there is provided: A process for etching trenches in silicon, comprising the steps of: providing a silicon substrate having thereon a patterned hard mask comprising silicon oxides and being defined to expose said silicon only in predetermined trench locations; etching a trench in said predetermined trench locations of said silicon substrate under conditions such that oxides of silicon are continually deposited on sidewalls of said trench during etching, wherein substantially all of the atomic oxygen in said oxides on said trench sidewalls derives from said hard mask.

According to the present invention there is provided: An integrated circuit incorporating trench capacitors, comprising: a dynamic random access memory comprising an array of memory cells, said cells in said array individually comprising a pass transistor in series with a storage capacitor, at least one plate of said storage capacitor being formed in silicon at the face of a trench; wherein said trench has straight sidewalls without bowing or undercut at a positive sidewall angle in the range of 80 to 89 degrees.

According to the present invention there is provided: An integrated circuit including trench isolation, comprising: a silicon substrate including therein a plurality of active device areas comprising transistors; a plurality of trenches separating said active device areas in a predetermined isolation pattern; wherein each said trench has straight sidewalls without bowing or undercut at a positive sidewall angle in the range of 80 to 89 degrees.

BRIEF DESCRIPTION OF THE DRAWINGS

The present invention will be described with reference to the accompanying drawings, wherein.

DESCRIPTION OF THE PREFERRED EMBODIMENTS

The presently preferred embodiments will now be discussed in great detail. However, it should be appreciated that the present invention provides widely applicable inventive concepts, which can be embodied in a tremendous variety of specific contexts; the specific embodiments discussed are merely illustrative of specific ways to make and use the invention, and do not delimit the scope of the invention.

Figure 1:
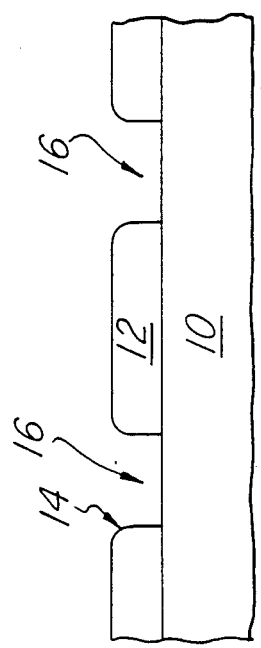
FIG. 1 shows a first step in practising a sample embodiment of a process according to the present invention.
Figure 4:
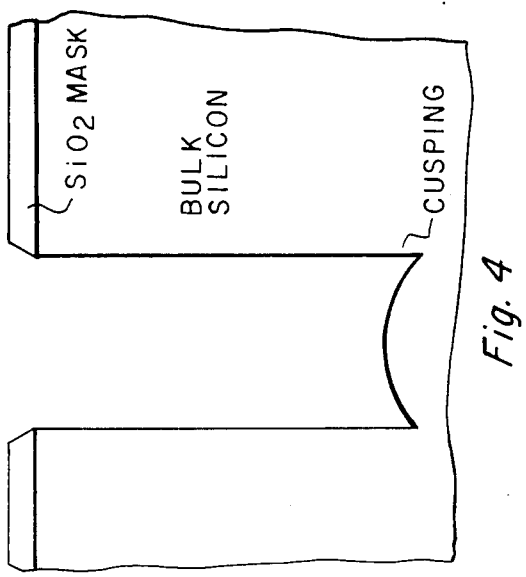
FIG. 4 dramatically illustrates the effect of eliminating sidewall deposition during silicon etch employing a modified trench etch process. Without the sidewall oxide, severe grooving and moderate undercut are observed.

FIG. 1 shows a first step in practising a sample embodiment of a process according to the present invention. A patterned hard mask 12 of silicon dioxide is in place on a silicon substrate 10, defining openings to expose the substrate 10 at predetermined trench locations 16.

A multi-stage gradation in etch conditions is preferable to optimize the oxide deposition at various stages. This feature of the present invention permits the dynamic process of forward erosion and redeposition to provide the very straight trench sidewalls desired, while still remaining reproducible.

With the less preferred conditions set forth below as embodiment B, the trench sidewalls would be fairly vertical (although not undercut) for the micron or two closest to the mouth of the trench. The reason for this effect is that the oxide mask is faceted during etching of the trench, so that at the beginning of the etch, before the oxide mask is significantly faceted, there is less material available for sputtering and redeposition. Thus, the present improvements on the prior application include changes designed to amplify the buildup of sputtered material in the initial couple of microns of etching.

Similarly, a problem with some of the less preferred embodiments is that cusping can sometimes occur at the bottom of the trench. This has been found to be due to ions glancing off the etched sidewall of the trench, and again this problem can be alleviated by more sidewall deposition to reduce efficient glancing reflecton of incident ions.

The presently preferred embodiment uses an 8130 reactor (a commercially available batch mode RIE reactor) to dig an 8 micron trench (8 micron post hole), with an 8 to 1 aspect ratio. The presently preferred etching conditions use a silicon etch in several stages, including:

1. BCl$_3$+Ar is used as the etch gas for initialization (or cleanup) and to remove the first couple of thousand angstroms of silicon. Flows: BCl$_3$ 50 sccm; Ar 50 sccm; Pressure 20 mTorr; −200 volts bias
2. SiCl$_4$+N$_2$+HCl is used as the etchant for the next two microns. As noted, use of silicon tetrachloride tends to amplify the buildup of redeposited oxide material in this region. Flows: SiCl$_4$ 10 sccm: N$_2$ 50 sccm; HCl 40 sccm; Pressure 15 mTorr; −400 volts bias
3. Pure HCl is used for the next two microns of etching. Flows: HCl 40 sccm; Pressure 15 mTorr; −400 volts bias.
4. HCl+SiCl$_4$+N$_2$ is used for the last four microns. Moreover, the power during the last four microns is preferably raised slightly (in the presently preferred embodiment, the bias voltage is raised from 400 volts to 450 volts), which gives reduced selectivity to oxide and increased etch rate.

Flows: HCl 40 sccm; SiCl$_4$ 10 sccm; N$_2$ 50 sccm; Pressure 15 mTorr.

A possible problem with using some of the materials (such as SiCl$_4$) which promote deposition of oxides on the sidewall is gas phase generation of particulates. However, the present invention avoids this as a significant problem, simply by keeping the pressure significantly low that the probability of nucleated particles colliding in the gas phase to agglomerate is quite low.

In another class of embodiments, a different class of chemistries has been developed in a single-slice RIE reactor. HBr is used as the basic silicon etching material, which gives an etch rate of about one and one-half microns per minute with 10 to 1 or 15 to 1 selectivity over oxide. To increase sidewall buildup, nitrogen plus argon is preferably added to the feed gas. The mechanism by which nitrogen helps increase sidewall buildup is not well understood. The sidewall buildup may well be oxynitrides and not merely oxides. Alternatively, to increase sidewall buildup, carbon monoxide can be introduced (or carbon dioxide can be included in the feed gas, which will form carbon monoxide in the discharge). Since carbon monoxide is isoelectronic with nitrogen, but has more active electrons, carbon monoxide may be more active than nitrogen and further increase sidewall deposition.

Naturally, these etching conditions can be widely varied. In general, a wide variety of prior art conditions can be used, as long as they give forward sputtering (and/or reactive redeposition) of the hard mask. However, there are some particular advantages to the etch composition given. For example, use of HCl rather than $Cl_2$ as the primary source of chlorine means that mask forward sputtering is enhanced, since bombardment is predominantly by $Cl+$ ions rather than $Cl_2+$ ions, and the $Cl+$ ions better match the average atomic number of the mask material, which tends to provide higher sputtering yield (or at least a higher total for sputtering yield plus ion reflections). In fact, it has been found that use of HCl rather than $Cl_2$ as the predominant etch feed gas component contributes substantially to the success of the present inventive process. (In general, in modifying the present invention, etchant ion species is one of the variables which can be adjusted to control the amount of sidewall deposition and therefore the resulting trench profile.) Some of the advantages of HCl may be due to the fact that it is also likely to be a source of atomic hydrogen, which may play a role in the sidewall deposition.

Chlorine accelerates the etch rate significantly, but it has been found that even a minority fraction of $Cl_2$ aggravates cusping at the bottom of the trench. Therefore, the presently preferred etchant gas flow is 40 sccm of HCl, with no chlorine at all.

Use of higher pressures for etching the last portion of the trench tends to produce pointed trench bottoms; use of lower pressure will reduce the etch rate. Use of lower bias voltage will reduce sidewall oxide deposition and etch rate, and (if much lower) will begin to lead to isotropic etching characteristics. Use of a higher bias will increase sidewall oxide deposition and etch rate, but will also increase erosion of the oxide mask, which if excessive can lead to loss of linewidth control. As noted, introduction of a small amount of an inorganic chloride such as $BCl_3$ will facilitate oxide etching, and therefore retard deposition of the sidewall oxide, and therefore produce a steeper trench sidewall.

Another factor which affects the degree of forward sputtering, and therefore the trench sidewall angle, is the initial sidewall slope of the hard mask sidewalls. That is, in FIG. 1 the sidewalls 14 of the oxide hard mask 12 are preferably not quite at a 90 degree angle: angles of 80 to 89 degrees are preferred. More sloped hard mask sidewalls will in general lead to more hard mask forward sputtering, although excessive hard mask sidewall slope will lead to mask faceting and loss of control over linewidth, and possible silicon damage at the upper corners of the trench. In the presently preferred embodiment, a photostabilized photoresist (using deep UV flood exposure plus an extra postbake) is used to set an initial resist sidewall angle of about 82 degrees; a slightly higher photoresist sidewall might be preferable, but a 90 degree resist sidewall is definitely more steep than is desirable. The resist sidewall profile will be transferred into the oxide hardmask sidewall angle during the oxide etch which patterns the hardmask.

The initial sidewall angle of the oxide is important, because the process of the present invention is a highly dynamic process: the forward sputtering proceeds continuously during the whole silicon etch, so the initial mask angle can directly or indirectly affect etching results for a considerable distance. In the presently preferred embodiment, the initial mask angle is primarily defined by transfer from the photoresist sidewall angle; but alternatively, the etching conditions of the first etching step could be changed to provide some additional initial faceting of the hardmask. For example, the presently preferred embodiment, as described above, uses an initial $BCl_3$ etch primarily for cleanup and initialization, but the conditions used for this first step of etching could alternatively be changed (higher bias voltage, differant feed gas species, etc) to provide some initial faceting. (However, note again that the initial sidewall slope on the hardmask must be steep, or erosion of the mask will cause the mask to recede, providing a trench which is widened at the top.)

Figure 7:
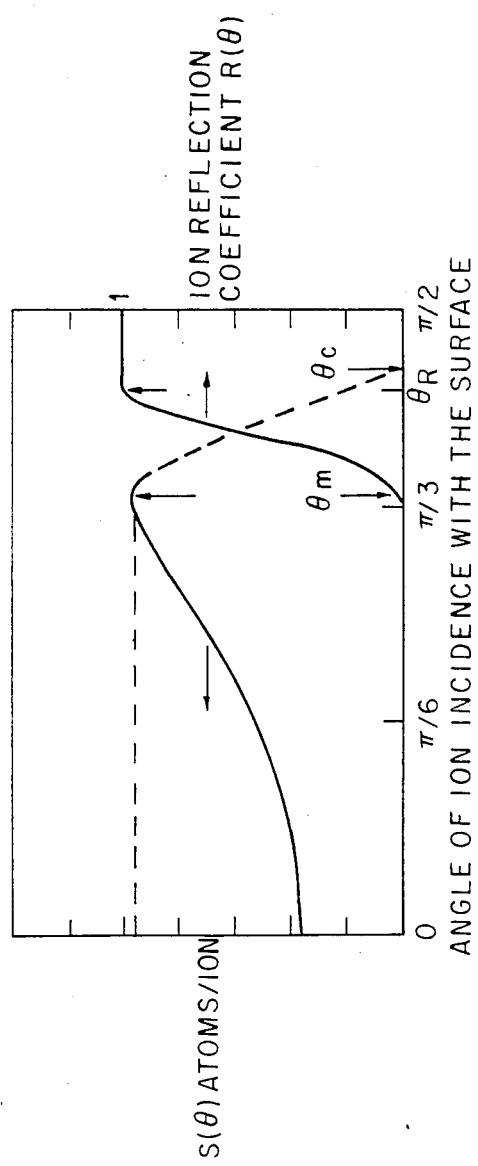
FIG. 7 shows a sample curve of sputtering yield $S(\theta)$ and ion reflection coefficient $R(\theta)$ as functions of the angle $\theta$ of ion incidence with the surface.

FIG. 7 shows a sample curve of sputtering yield $S(\theta)$ and ion reflection coefficient $R(\theta)$ as functions of the angle $\theta$ of ion incidence with the surface. The implication of this curve for the present invention is that the mask sidewall angle $\theta_s$ should be in the range between $\theta_m$ (the incidence angle where ion reflection becomes negligible) and $\theta_c$ (the incidence angle where sputtering yield becomes negligible). Preferably the mask angle should not be too close to either $\theta_m$ or $\theta_c$, but should be somewhere in the middle portion of this range. To increase this middle range, the following factors may be adjusted. The degree of forward sputtering will be increased by:

increasing the ion energy (by increasing the plasma sheath potential);
decreasing the atomic number of the mask material;
decreasing the atomic number of the dominate impinging ion; or
decreasing the density of the target material.

In general, ion reflection (which leads to cusping) will set in at a minimum angle $\theta_m$ defined by:

$$\frac{\pi}{2} - \theta_m = \frac{5\pi a_o^2 n^{(\frac{1}{3})} Z_1 Z_2 E_R}{(Z_1^{(\frac{1}{3})} + Z_2^{(\frac{1}{3})}) E_I},$$

where
$a_o$ is the hydrogen Bohr radius,
$Z_1$ is the ion atomic number,
$Z_2$ is the target species atomic number,
n is the target density,
$E_R$ is the Rydberg energy, and
$E_I$ is the ion energy.

The silicon etch conditions used are preferably highly anisotropic (like those described above), so that control of the trench sidewall slope is entirely dependent on the sidewall deposition characteristics. The presently preferred embodiment gives straight trench sidewalls sloped at $86\pm1$ degrees. For some device applications it might be preferable to use a sidewall angle of 87 or even 88 degrees instead, and this can be achieved (as noted above) by introducing a very small flow of an oxide etchant such as $BCl_3$ into the feed gas mixture, to reduce the forward deposition of material on the sidewalls, or by lowering the overall pressure (which would reduce gas-phase nucleation of the sidewall deposits). The present invention could also be used with silicon etch conditions which were not so inherently anisotropic, although this is not preferred.

The trench etching conditions of the less preferred embodiment B will now be set forth. The etching conditions set forth above have been found to be preferable, but this embodiment B also embodies key concepts of the invention and does provide crucial advantages. In this sample embodiment, the silicon trench etch is conducted in a hexode-style, RIE batch reactor under the following conditions:

1. STEP ONE:
(a) HCl 40 sccm
(b) $BCl_3$ 10 sccm
(c) pressure 15 milliTorr
(d) bias −300 Volts
(e) temperature 60 degrees C.
(f) time 5 minutes 2. STEP TWO:
(a) HCl 40 sccm
(b) $Cl_2$ 5 sccm
(c) pressure 15 milliTorr
(d) bias −400 Volts
(e) temperature 60 degrees C.
(f) time in accord with etch depth required; for example, about 40 minutes to etch a 3 micron trench.

The first step of the etch serves to cut through the native oxide which silicon will typically form on even brief exposure to air. Gas flow rates are specified as sccm, i.e. standard cubic centimeters per minute. The etch conditions used correspond to an area power density of about 400 milliWatts per square centimeter, and to a volumetric plasma power density of about 7 Watts per liter.

After the trench has been etched to the desired depth, a cleanup step is preferably used (depending on the particular device fabrication sequence used) to remove the oxide from the sidewalls of the etched trench. This can be, for example, a short wet etch in HF or a short high-pressure plasma fluoro-etch.

Note that the general idea of trench etching using forward sputtering (or reactive redeposition) of a hard mask is itself novel, and can be embodied in a tremendous range of modifications and variations. For example, other hard mask materials, such as silicon nitride or even photoresist can be used, although oxide hard masks are greatly preferred to provide more controllable forward sputtering with good control of mask erosion. As noted in the HBr embodiment described, some of the embodiments already built and tested are believed to contain a significant fraction of nitrogen in the sidewall deposited material. Photoresist masks turn out to be more sensitive to the initial sidewall angle of the mask material.

Figure 2:
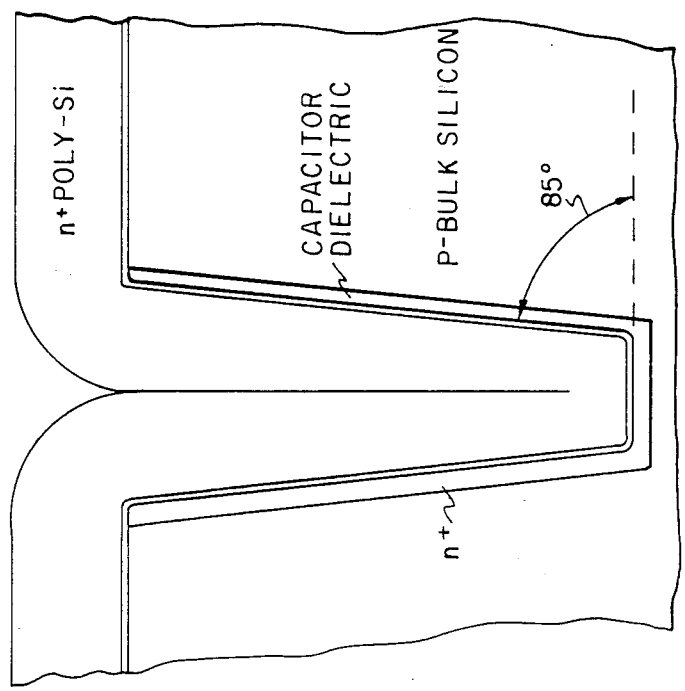
FIG. 2 shows a sample 3 micron deep trench etched and subsequently processed to generate a trench capacitor for a megabit dynamic RAM.
Figure 3A:
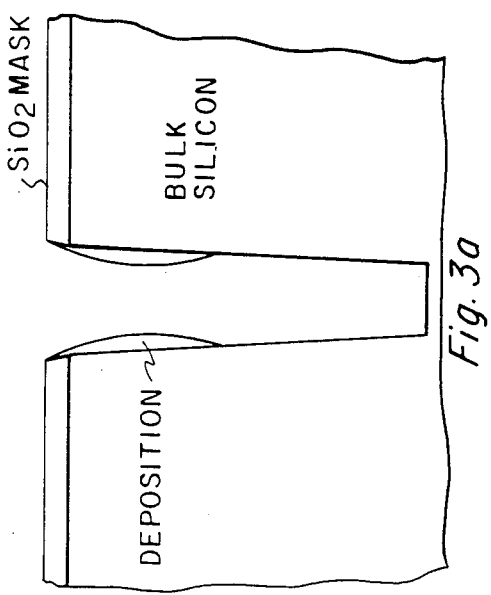
FIGS. 3a and 3b show examples of sidewall deposition on a silicon trench observed (FIG. 3a) immediately after etch and (FIG. 3b) after elimination of the sidewall deposits with a 30 second 10% HF dip.
Figure 3B:
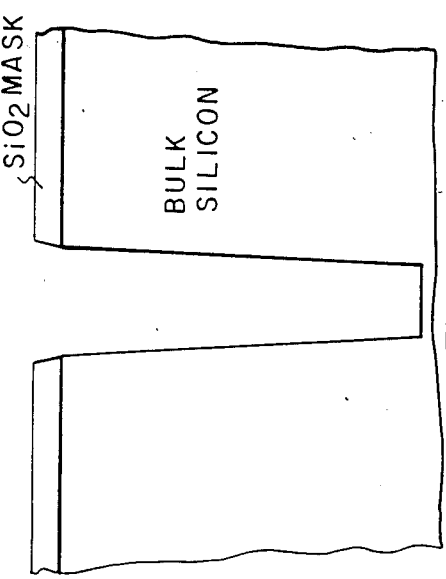

FIG. 2 shows a sample 3 micron deep trench etched and subsequently processed to generate a trench capacitor for a megabit dynamic RAM. FIG. 3 shows examples of sidewall deposition on a silicon trench observed (FIG. 3a) immediately after etch and (FIG. 3b) after its elimination with a 30 second 104 dramatically illustrates the effect of eliminating sidewall deposition during silicon etch employing a modified trench etch process. Without the sidewall oxide, severe grooving and moderate undercut are observed.

Figure 5:
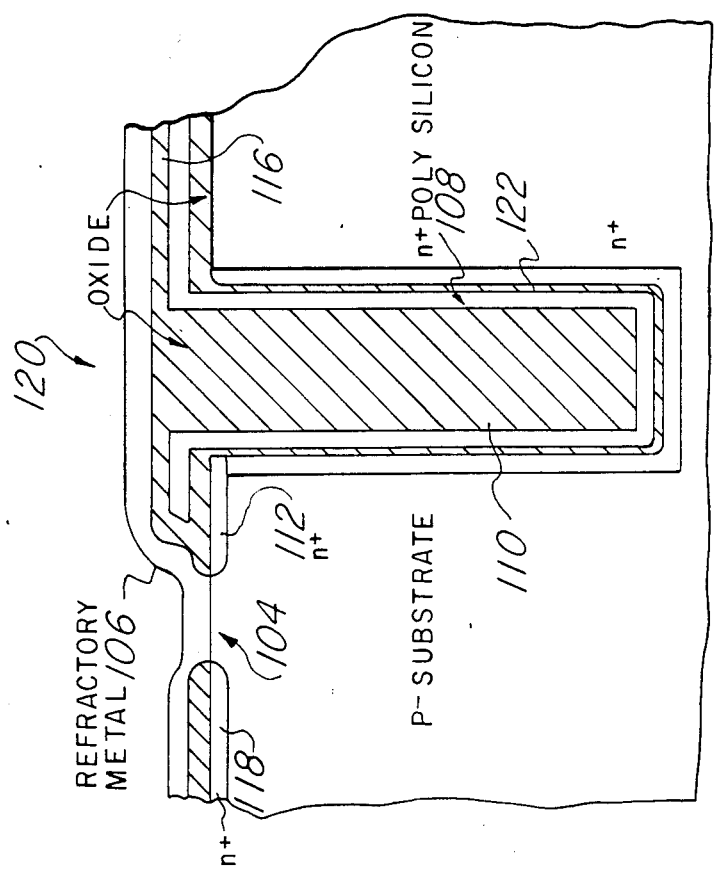
FIG. 5 shows a sample DRAM cell employing a trench capacitor wherein the trench has positively sloped steep sidewalls and a flat bottom according to the present invention.

FIG. 5 shows a sample DRAM cell employing a trench capacitor wherein the trench has positively sloped steep sidewalls and a flat bottom according to the present invention. A pass transistor 104, addressed by a refractory metal gate 106, connects a bit line 118 to an n+ diffusion 112 which forms one plate of the trench capacitor, the other being polysilicon layer 108. The trench capacitor is formed in a trench 120 which has straight positively-sloped sidewalls. A thin oxide 122 provides the dielectric for the trench capacitor, and an oxide 110 refills the trench. A patterned oxide 116 provides isolation. The trench is etched to a depth of 8 microns; approximately the top two microns of this are required for the pass transistor. The wafer used is p-on-p+ epitaxial, so that the bottom 4 microns of the capacitor provide most of the capacitance.

That is, an advantage of the extremely deep trenches provided by the present invention is that the doping at the bottom of the trench can be very difficult from that at the top of the trench. One way to do this is simply to cut through an active device layer into the substrate; e.g. in the presently preferred embodiment the substrate doping is about 1E19 p-type, and the epitaxial layer is about 4 microns thick. (Updiffusion will provide a gradually decreasing doping from 4 microns depth up to about 2 microns depth.) The active device channel regions have about 1E16 doping p-type at a depth of 1.5 microns, and are overlaid (in this example) by a buried n+ layer one micron deep and doped to about 1E20, which forms the bitline of the DRAM array. However, the advantages of higher doping at the bottom of the trench can also be achieved in other ways; for example by implantation, or diffusion from a solid source, or from a gas-phase dopant source species.

The present invention provides high-quality trench capacitors, and their use is of course not limited to DRAMs, nor even to circuits like DRAMs which make essentially DC use of grounded capacitors for charge-pumping. The high capacitance per unit surface area provided by the present invention may also be very useful in many switched-capacitor filter topologies. Many other DC and RF filter topologies use capacitors to ground, and can also profit by inclusion of trench capacitors according to the present invention. In filter applications, the several tens to several hundreds of fF of capacitance typically provided by a single trench is usually too small a value, so preferably many trench capacitors will be connected in parallel to form a capacitor having sufficiently small kT/C noise characteristics. Moreover, trench capacitors to ground according to the present invention may also be very useful in providing an RF ground in RF integrated circuits.

The presently most preferred embodiments use the present invention to etch trenches which are from 3 to 10 microns deep, but alternatively the present invention can be used to etch deeper trenches: the embodiments described are approximately minimum geometry, because the capacitance available from a minimum geometry capacitor is enough for a DRAM cell. However, the present invention can also be used to etch deeper trenches with the same aspect ratio: for example, a trench which was 6 microns square at the top could be etched to a depth of 40 microns or more using the present invention. In etching extremely deep trenches, it is of course desirable not to permit the trench to taper to a point, so the depth will typically be selected so that the bottom of the trench is still flat. Similarly, shallower trenches could also be etched using the present invention; this may become more preferable as submicron geometries are more widely used for patterning.

It should also be noted that the capacitors in the presently preferred embodiments are preferably capacitors to ground, as used in DRAM circuits. However, this is not an inherent limitation. For example, in SOI structures or in epitaxial structures having deep junction isolation, isolation trenches could be placed to surround the trench capacitor, so that the potential of the bottom plate of the capacitor could also be accessed, while still taking advantage of very heavy doping at the level of the lower part of the capacitor trenches.

Trenches according to the present invention can also be very advantageous for vertical logic structures. The DRAM cell described has one transistor in the trench, with vertical current flow; but it may be advantageous for logic applications to put more than one active device in a trench. In this case, again, the excellent control over sidewall profile provided by the present invention may be extremely useful. In particular, in fabrication flows which depend on long etchbacks to provide a buried planar surface, the void-free characteristics provided by the present invention may be critical.

Figure 6:
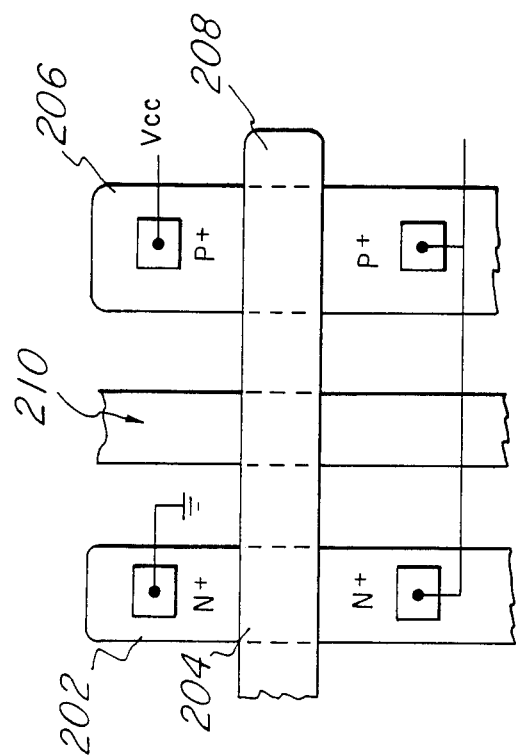
FIG. 6 shows an example of a CMOS structure employing trench isolation, wherein n+ to p+ spacing is reduced by use of an oxide-filled trench having positively sloped steep sidewalls and a flat bottom.

In general, trenches according to the present invention are also highly advantageous for isolation. FIG. 6 shows an example of a CMOS structure employing trench isolation, wherein the spacing permissible between n+ diffusion 202 in NMOS transistor 204 and p+ diffusion 206 in PMOS transistor 208 is reduced by use of an oxide-filled trench 210, which has positively sloped steep sidewalls and a flat bottom, for isolation.

Thus the present invention provides several crucial advantages over the prior art, including among others the following: a positively sloped silicon trench sidewall without undercut is provided, which permits facile subsequent refill processing; the positive sidewall slope is achieved without a sacrifice in control of the pattern dimension; and the "grooving" problem, commonly observed at the bottom of the trench, is eliminated, and instead a good flat trench bottom is provided.

As will be appreciated by those skilled in the art, the present invention can be widely modified and varied, and its scope is not limited except as specified in the allowed claims.

What is claimed is:

1. A process for etching trenches in silicon, comprising the steps of:
   (a) providing a patterned mask over a silicon substrate;
   (b) plasma etching exposed portions of said silicon substrate under etch conditions such that the material of said mask is forward sputtered to induce deposition on sidewalls of said trench during etching.

2. A process for etching trenches in silicon, comprising the steps of:
   (a) providing a silicon substrate having thereon a patterned hard mask comprising silicon oxides and being defined to expose said silicon only in predetermined trench locations;
   (b) etching a trench, by means of a plasma source of silicon etchant ions, in said predetermined trench locations of said silicon substrate under conditions such that oxides of silicon are continually deposited on sidewalls of said trench during etching, wherein substantially all of the atomic oxygen in said oxides on said trench sidewalls derives from said hard mask.

3. The process of claim 1, wherein said mask consists essentially of silicon oxides, and wherein said trench etch comprises etching in a glow discharge formed in an etch gas containing one or more chlorine-bearing species, and said chlorine-bearing species consist predominantly of hydrogen chloride.

4. The process of claim 1, wherein said mask consists essentially of silicon oxides, and wherein said trench etch comprises plasma etching in an etch gas which provides a source of Cl+ ions in greater quantity than of $Cl_2+$ ions.

5. The process of claim 1, wherein said trench etch is performed at a total pressure in the range of 1 to 100 milliTorr.

6. The process of claim 1, wherein said openings in said mask have a sidewall angle, prior to said trench etch, in the range of 80 to 89 degrees.

7. The process of claim 1, wherein said trench etch is performed at a bias voltage in the range of 250 to 550 volts.

8. The process of claim 2, wherein said mask consists essentially of silicon oxides, and wherein said trench etch comprises plasma etching in an etch gas containing chlorine-bearing species, and said chlorine-bearing species consist predominantly of hydrogen chloride.

9. The process of claim 2, wherein said mask consists essentially of silicon oxides, and wherein said trench etch comprises plasma etching in an etch gas which provides a source of Cl+ ions in greater quantity than of $Cl_2+$ ions.

10. The process of claim 2, wherein said trench etch is performed at a total pressure in the range of 1 to 100 milliTorr.

11. The process of claim 2, wherein said openings in said mask have a sidewall angle, prior to said trench etch, in the range of 80 to 89 degrees.

12. The process of claim 2, wherein said trench etch is performed at a bias voltage in the range of 250 to 550 volts.

13. The process of claim 2, wherein said trench etching plasma includes a small fraction of an oxide-etching species, said small fraction being preselected to adjust the rate of deposition of said sidewall oxides.

14. The process of claim 2, wherein said plasma etching is performed at a volumetric power density in the range of 5 to 10 Watts per liter.

15. The process of claim 2, wherein said trench etch comprises plasma etching in an etch gas comprising hydrogen chloride.

16. The process of claim 1, wherein said trench etch comprises plasma etching in an etch gas comprising hydrogen chloride.

17. A process for etching trenches in silicon, comprising the steps of:
   (a) providing a patterned mask over a silicon substrate;
   (b) etching exposed portions of said silicon substrate in proximity to a glow discharge under etch conditions such that the material of said mask is forward sputtered to induce deposition on sidewalls of said trench during etching, said conditions being adjusted during etching so that said deposition on said sidewalls of said trench is enhanced during the first 20% of depth of said trench and also during the last 20% of depth of said trench.

18. A process for etching trenches in silicon, comprising the steps of:

(a) providing a silicon substrate having thereon a patterned hard mask comprising silicon oxides and being defined to expose said silicon only in predetermined trench locations;
(b) etching a trench,
  i. by means of a plasma source of silicon etchant ions,
  ii. in said predetermined trench locations of said silicon substrate
  iii. under conditions such that a material including a substantial fraction of oxides of silicon is continually deposited on sidewalls of said trench during etching,
  iv. said conditions being adjusted during etching so that said deposition on said sidewalls of said trench is enhanced during the first 20% of depth of said trench and also during the last 20% of depth of said trench;
  v. wherein substantially all of the atomic oxygen in said material deposited on said sidewalls of said trench derives from said hard mask.

19. The process of claim 18, wherein said etching is initialized using an etchant composition which is not highly selective to oxide.

20. The process of claim 17, wherein said etching is initialized using an etchant composition which is not highly selective to oxide.

21. The process of claim 18, wherein a source of silicon-bearing radicals is introduced to increase sidewall deposition during at least the first 20% of depth of said trench and the last 20% of depth of said trench.

22. The process of the 21 claim, wherein said source of silicon-bearing radicals consists essentially of a halated silane compound.

23. The process of the 22 claim, wherein said halated silane compound comprises a chlorosilane.

24. The process of the 22 claim, wherein said halated silane compound consists essentially of $SiCl_4$.

25. The process of claim 17, wherein a source of silicon-bearing radicals is introduced to increase sidewall deposition during at least the first 20% of depth of said trench and the last 20% of depth of said trench.

26. The process of the 25 claim, wherein said source of silicon-bearing radicals consists essentially of a halated silane compound.

27. The process of the 26 claim, wherein said halated silane compound comprises a chlorosilane.

28. The process of the 27 claim, wherein said halated silane compound consists essentially of $SiCl_4$.

* * * * *